United States Patent
Lalgudi et al.

(10) Patent No.: US 9,514,097 B2
(45) Date of Patent: Dec. 6, 2016

(54) SYSTEM AND METHOD FOR TESTING CAUSALITY OF TABULATED S-PARAMETERS

(71) Applicant: SAS IP, Inc., Cheyenne, WY (US)

(72) Inventors: Subramanian Lalgudi, Natick, MA (US); Saeed Asgari, Shrewsbury, MA (US)

(73) Assignee: SAS IP, Inc., Cheyenne, WY (US)

( * ) Notice: Subject to any disclaimer, the term of this patent is extended or adjusted under 35 U.S.C. 154(b) by 753 days.

(21) Appl. No.: 13/900,283

(22) Filed: May 22, 2013

(65) Prior Publication Data

US 2013/0325420 A1    Dec. 5, 2013

Related U.S. Application Data

(60) Provisional application No. 61/650,028, filed on May 22, 2012.

(51) Int. Cl.
| | | |
|---|---|---|
| G06F 7/60 | (2006.01) | |
| G06F 17/17 | (2006.01) | |
| G06F 17/50 | (2006.01) | |

(52) U.S. Cl.
CPC ............. *G06F 17/17* (2013.01); *G06F 17/504* (2013.01); *G06F 17/5036* (2013.01)

(58) Field of Classification Search
CPC .. G06F 17/17; G06F 17/5036; G06F 17/504; G06F 17/10; H04B 3/40
USPC .................................. 703/2, 4, 5, 13, 14, 22
See application file for complete search history.

(56) References Cited

U.S. PATENT DOCUMENTS

| | | | | |
|---|---|---|---|---|
| 8,046,208 B1* | 10/2011 | Cai | ...................... | G06F 17/5036 703/13 |
| 2010/0280801 A1* | 11/2010 | Deschrijver | ........ | G06F 17/5036 703/2 |

OTHER PUBLICATIONS

Triverio (Robust Causality Characterization via Generalized Dispersion Relations, IEEE Transactions on Advanced Packaging, vol. 31, No. 3, Aug. 2008).*
Gustavesn (Rational Approximation of Frequency Domain Response by Vector Fitting, IEEE Transactions on Power Delivery, vol. 14, No. 3, Jul. 1999).*
Asgari (Analytical Integration-based Causality Checking of Tabulated S-parameters, IEEE 2010).*
Krizan_2011 (S-parameter approximation using rational function; University of Zagreb, Nov. 6, 2011).*
Shlepnev_2011 (Quality of S-parameter modles: Asian IBIS Summit, Yokohama, Nov. 18, 2011).*
Triverio, et al., "Robust Causality Characterization via Generalized Dispersion Relations", IEEE Transactions on Advanced Packaging, vol. 31, No. 3, Aug. 2008, pp. 579-593.
Asgari, et al., "Analytical Integration-based Causality Checking of Tabulated S-parameters", IEEE, 2010, pp. 189-192.
Gustavsen, et al., "Rational Approximation of Frequency Domain Responses by Vector Fitting", IEEE Transactions on Power Deliver, vol. 14, No. 3, Jul. 1999, pp. 1052-1061.
International Preliminary Report on Patentability and Written Opinion of the International Searching Authoirty dated Dec. 4, 2014 from related / corresponding PCT Patent Application U.S. Appl. No. PCT/US2013/042262, filed May 22, 2013.

* cited by examiner

*Primary Examiner* — Aniss Chad
*Assistant Examiner* — Scott S Cook
(74) *Attorney, Agent, or Firm* — Jones Day

(57) ABSTRACT

A system. The system includes a computing device having a processor, and a causality checker module communicably connected to the processor. The causality checker module is configured to utilize a rational function approximation to a frequency response to determine if a transfer function of a linear time invariant system is causal.

23 Claims, 5 Drawing Sheets

SYSTEM AND METHOD FOR TESTING CAUSALITY OF TABULATED S-PARAMETERS

CROSS-REFERENCE TO RELATED APPLICATION

This application claims the benefit under 35 U.S.C. §119(e) of the earlier filing date of U.S. Provisional Patent Application No. 61/650,028 filed on May 22, 2012.

BACKGROUND

This application discloses an invention which is related, generally and in various embodiments, to a system and method for testing causality of tabulated S-parameters.

It is known to utilize scattering parameters (S-parameters) to describe the electrical behavior of linear electrical networks. In the S-parameter approach, the electrical network is treated as a black box which contains various interconnected electrical circuit components which interact with other electrical circuits through ports. The electrical network can be represented by a square matrix of complex numbers (its S-parameter matrix) which can be used to calculate the network's response to signals applied to the ports.

It is also known to test S-parameters for the proper cause/effect relationship (causality). With respect to such electrical networks, a basic requirement of causality is that after a stimulus has been applied to the electrical network, the electrical network's response to the applied stimulus must occur after the application of the stimulus. During transient simulation of S-parameters, a macromodel approximating the S-parameters is utilized. However, if the S-parameters are actually noncausal, the simulation results obtained using the macromodel will likely not accurately reflect the actual electrical behavior of the network.

Testing causality of tabulated frequency data is based on the property that only a causal frequency response is invariant upon applying the generalized Hilbert transform (GHT). However, this property has been difficult to verify for tabulated data (data known for finite number of frequencies in a finite bandwidth), because the GHT requires knowledge of frequency response at all frequencies in infinite bandwidth.

A first known method, described in the publication "Robust causality characterization via generalized dispersion relations," IEEE Trans. Advanced Packaging, Vol. 31, No. 3, August 2008 authored by P. Triverio and S. Grivet-Talocia (hereinafter "the Triverio method") removed this difficulty by proposing an algorithm that accounted for errors due to both finite bandwidth (corresponding error is referred to as the truncation error) and finite number of frequencies (referred to as the discretization error). Specifically, it provided a closed-form expression for a tight upper bound for the truncation error, and this bound can be used to arbitrarily control the truncation error. It accounted for the discretization error by accounting for the error in the numerical integration, used in the evaluation of the GHT.

However, the Triverio method is not clear about another source of discretization error: the interpolation error. Each tabulated frequency response needs to be interpolated because of the continuous nature of the integration in the GHT. This interpolation introduces an additional error in the GHT calculation on top of the numerical integration error. When this interpolation error is not accounted for, the bound for the discretization error is underestimated, which can result in a false positive outcome (i.e., a causal tabulated frequency response falsely declared as noncausal).

A second known method, described in the publication "Analytical integration-based causality checking of tabulated S-parameters," IEEE Conference on Electrical Perf. of Electronic Packag., October 2010 authored by S. Asgari, S. N. Lalgudi, and M. Tsuk (hereinafter "the Asgari method"), includes the contribution from interpolation error in the discretization error, through a different formulation. In this formulation, tabulated frequency response is first interpolated through cubic-splines, and the test on tabulated frequency response is converted to an equivalent test on the interpolation function. Because of this equivalency and the polynomial nature of the interpolating function, a closed-form expression for the GHT is derived in terms of the spline coefficients. As a result, numerical integration needed in the Triverio method to evaluate the GHT is avoided, making the interpolation error the only contribution to the discretization error. The discretization error bound is, then, calculated similar to the Triverio method by varying the interpolation functions in place of the numerical integration rules.

However, the closed-form expressions for numerical GHT in the Asgari method can produce unbounded values if tabulated frequencies are highly nonuniformly spaced, like in logarithmically-spaced frequencies.

The formulation associated with the Asgari method is now described in the context of determining whether or not a given frequency response is causal. Consider a frequency response $H(j\omega)$ of a linear time-invariant (LTI) system that is only known for tabulated frequencies $\{f_k\}N_{fk}=1$, where $f_1=0$, $f_k < f_{k+1}$, and $N_f$ is the total number of frequencies. The symbol $\omega$ is the angular frequency, where $\omega = 2\pi f$.

The solution to the problem of determining whether or not $H(j\omega)$ is casual is based on the generalized Hilbert transform of $H(j\omega)$:

$$H_n(j\omega) = \mathcal{L}_H(j\omega) + \frac{\prod_{q=1}^{n}(\omega - \overline{\omega}_q)}{j\pi} \int \frac{H(j\omega') - \mathcal{L}_H(j\omega')}{\prod_{q=1}^{n}(\omega' - \overline{\omega}_q)} \frac{d\omega'}{\omega - \omega'}, \quad (1)$$

where n is the number of subtraction points, and $\{\overline{\omega}_q\}^n$ q=1 are the subtraction points spread over the interval $\Omega = [-\omega_{max}, \omega_{max}]$, where $\omega_{max} = 2\pi f_{max}$, and $f_{max} = f_{Nf}$. In equation (1), the symbol f denotes the integral according to the Cauchy principal value. The term $\mathcal{L}_H(j\omega)$ in equation (1) is the Lagrange interpolation polynomial for $H(j\omega)$:

$$\mathcal{L}_H(j\omega) = \sum_{q=1}^{n} H(j\overline{\omega}_q) \prod_{\substack{p=1 \\ p \neq q}}^{n} \frac{\omega - \overline{\omega}_p}{\overline{\omega}_q - \overline{\omega}_p}. \quad (2)$$

Using the GHT, a procedure to detect noncausality can be devised: If and only if $H(j\omega)$ is causal, $H_n(j\omega)$ from equation (1) is equal to $H(j\omega)$; thus, if the magnitude of the error $$\Delta_n(j\omega) = H_n(j\omega) - H(j\omega) \quad (3)$$

is zero, then $H(j\omega)$ is declared causal; else, it is declared noncausal.

However, as only tabulated values of $H(j\omega)$ are available, $H_n(j\omega)$ cannot be computed exactly; only an approximation, say $\tilde{H}_n(j\omega)$, to it can be. As a result, the magnitude of the error $$\tilde{\Delta}_n(j\omega) = \tilde{H}_n(j\omega) - H(j\omega) \quad (4)$$

can be nonzero even for a causal H, causing a confusion about the causality of $H(j\omega)$. Therefore, the above detection procedure has to be modified to make a detection based on $\tilde{\Delta}_n(j\omega)$.

Any procedure to test causality of tabulated data should account for two sources of errors: (a) the (truncation) error due to not knowing $H(j\omega_k)$ outside $\Omega$ (outside the interval $\Omega=[-\omega_{max}, \omega_{max}]$), and (b) the (discretization) error due to not having continuous values of $H(j\omega_k)$ inside $\Omega$ (inside the interval $\Omega=[-\omega_{max}, \omega_{max}]$). The procedure to account for the truncation error is the same as that of the Triverio method and is described next. However, unlike the Triverio method, the Asgari method works with a simplified version of equation (1). It can be shown that equation (1) is same as $$H_n(j\omega) = \mathcal{L}_H(j\omega) + \frac{\prod_{q=1}^{n}(\omega - \overline{\omega}_q)}{j\pi} \int \frac{H(j\omega')}{\prod_{q=1}^{n}(\omega' - \overline{\omega}_q)} \frac{d\omega'}{\omega - \omega'}. \quad (5)$$

As $H(j\omega)$ is not known outside $\Omega$, it is only possible to evaluate equation (5) within $\Omega$. If $\hat{H}_n(j\omega)$ denotes the result of this evaluation, then $$\hat{H}_n(j\omega) = \mathcal{L}_H(j\omega) + \frac{\prod_{q=1}^{n}(\omega - \overline{\omega}_q)}{j\pi} \int_\Omega \frac{H(j\omega')}{\prod_{q=1}^{n}(\omega' - \overline{\omega}_q)} \frac{d\omega'}{\omega - \omega'}. \quad (6)$$

The truncation error, denoted as $E_n(j\omega)$, is the difference between $\hat{H}_n(j\omega)$ and $H_n(j\omega)$, i.e., $$E_n(j\omega) = \hat{H}_n(j\omega) - H_n(j\omega)$$

$$= \frac{\prod_{q=1}^{n}(\omega - \overline{\omega}_q)}{j\pi} \int_{\Omega^C} \frac{-H(j\omega')}{\prod_{q=1}^{n}(\omega' - \overline{\omega}_q)} \frac{d\omega'}{\omega - \omega'}. \quad (7)$$

This error can be controlled by increasing or decreasing n.

For the discretization error, the Asgari method follows a procedure similar to the Triverio method. Knowing a functional form of $H(j\omega)$ is necessary to compute equation (6). Because only tabulated values can be and are known, the $H(j\omega_k)$'s have to be interpolated (or approximated) between $\omega_k$'s. If $\tilde{H}(j\omega)$ denotes this approximation, then the resulting evaluation of equation (6) gives the quantity $\tilde{H}_n(j\omega)$ in equation (4). The discretization error, denoted as $D_n(j\omega)$, is defined as it was in the Triverio method:

$$D_n(j\omega)=\tilde{H}_n(j\omega)-\hat{H}_n(j\omega). \quad (8)$$

The error $\tilde{\Delta}_n(j\omega)$ in equation (4) can be shown to be $$\tilde{\Delta}_n(j\omega)=\Delta_n(j\omega)+E_n(j\omega)+D_n(j\omega). \quad (9)$$

In the Triverio method, closed-form expression for tightest upper bound, denoted as $T_n(\omega)$ for $|E_n(j\omega)|$ is utilized. The expression for this bound is shown below $$T_n(\omega) = \frac{1}{\pi} \sum_{q=1}^{n} \left[ \ln\frac{|\omega_{max} - \overline{\omega}_q|}{|\omega_{max} - \omega|} - (-1)^n \ln\frac{|\omega_{max} + \overline{\omega}_q|}{|\omega_{max} + \omega|} \right] \times \prod_{\substack{p=1 \\ p \neq q}}^{n} \frac{|\omega - \overline{\omega}_p|}{\overline{\omega}_q - \overline{\omega}_p}, \quad (10)$$

If $\tilde{D}_n(\omega)$ denotes an estimate for $|D_n(j\omega)|$, then per the Triverio method, $H(j\omega)$ is declared as noncausal if $$|\tilde{\Delta}_n(j\omega_k)|>T_n(\omega_k)+\tilde{D}_n(\omega_k) \exists k. \quad (11)$$

Since the test is with regard to an amplitude, say A, the right hand side of inequality (11), denoted as $E^{tot}_n(\omega_k)$, should first be made less than or equal to A, i.e., $$E^{tot}_n(\omega_k)=T_n(\omega_k)+\tilde{D}_n(\omega_k) \leq A \; \forall k. \quad (12)$$

If inequality (12) is not met, then the frequency steps in the tabulated data are not small enough to check for inequality (11); in this event, the data should be regenerated with subsequently smaller frequency steps until inequality (12) is satisfied.

In the Asgari method, the quantity $\tilde{D}_n(\omega)$ is computed by subtracting $\tilde{H}_n(j\omega)$'s from two different interpolation functions. That is, $$\tilde{D}_n(\omega) \approx |\tilde{H}_n^{\mu_1}(j\omega) - \tilde{H}_n^{\mu_2}(j\omega)|, \quad (13)$$

where $\mu_1$ and $\mu_2$ are two different interpolating functions. The quantity $\tilde{H}_n(j\omega)$ can be computed without numerical integration if $H(j\omega)$ is approximated as a piecewise polynomial:

$$H(j\omega) \approx \overline{H}(j\omega) = \sum_{k=-N_f}^{N_f-1} \underbrace{\sum_{l=0}^{L} a_{k,l}(\omega - \omega_k)^l 1_{\Omega_k}(\omega)}_{\overline{H}_{(k)}(j\omega)}, \quad (14)$$

where the symbol L is the maximum order of the piecewise polynomial (e.g., L=3 for cubic splines), the symbol $\Omega_k$ denotes the interval $[\omega_k, \omega_{k+1}]$, the symbol $1_{\Omega_k}(\omega)$ is the indicator function of $\omega$, defined as one for $\omega \in \Omega_k$ and as zero elsewhere, and $\alpha_{kl} \in \mathbb{C}$ is the spline coefficient corresponding to the kth interval and the lth power of $\omega$. When $\overline{H}(j\omega)$ from equation (13) is substituted for $H(j\omega)$ in equation (6), and the terms in the resulting equation are separated using partial fractions and subsequently analytically integrated, one gets $\overline{H}_n(j\omega)$:

$$\overline{H}_n(j\omega) = \mathcal{L}_{\overline{H}}(j\omega) + \frac{1}{j\pi} \sum_{k=-N_f}^{N_f-1} \left( \overline{H}_{(k)}(j\omega) \mathbb{L}(\omega, \omega_k, \omega_{k+1}) - \sum_{q=1}^{n} \overline{H}_{(k)}(j\omega_q) \mathbb{L}(\omega_q, \omega_k, \omega_{k+1}) \prod_{\substack{p=1 \\ p \neq q}}^{n} \frac{\omega - \omega_p}{\omega_q - \omega_p} \right), \quad (15)$$

where $$\mathbb{L}(\omega, \omega_k, \omega_{k+1}) = \ln\left|\frac{\omega_k - \omega}{\omega_{k+1} - \omega}\right|. \quad (16)$$

In the Asgari method, $\mu_1$ is chosen as cubic spline interpolation, and $\mu_2$ as piecewise cubic Hermite interpolation polynomial (PCHIP).

There are drawbacks to the Asgari method. Computing $\overline{H}_{(k)}(j\omega)$ in equation (15) requires extrapolation outside $\Omega_k$ if ω is not ∈Ω$_k$, as can be observed from the definition of $\bar{H}_{(k)}(j\omega)$ in equation (14). This extrapolation can sometimes result in unbounded values for $\tilde{H}_n(j\omega)$ in equation (15). This drawback is the consequence of using a closed form expression-based formulation along with a piecewise function. Also, because of the limited accuracy of piecewise polynomials, resolution of the causality checker is limited for given tabulated data. Thus, in view of the above, the overall effectiveness of the Asgari method is less than desired.

BRIEF DESCRIPTION OF THE DRAWINGS

Various embodiments of the invention are described herein in by way of example in conjunction with the following figures, wherein like reference characters designate the same or similar elements.

DETAILED DESCRIPTION

It is to be understood that at least some of the figures and descriptions of the invention have been simplified to illustrate elements that are relevant for a clear understanding of the invention, while eliminating, for purposes of clarity, other elements that those of ordinary skill in the art will appreciate may also comprise a portion of the invention. However, because such elements are well known in the art, and because they do not facilitate a better understanding of the invention, a description of such elements is not provided herein.

As described in more detail hereinbelow, aspects of the invention may be implemented by a computing device and/or a computer program stored on a computer-readable medium. The computer-readable medium may comprise a disk, a device, and/or a propagated signal.

Figure 1:
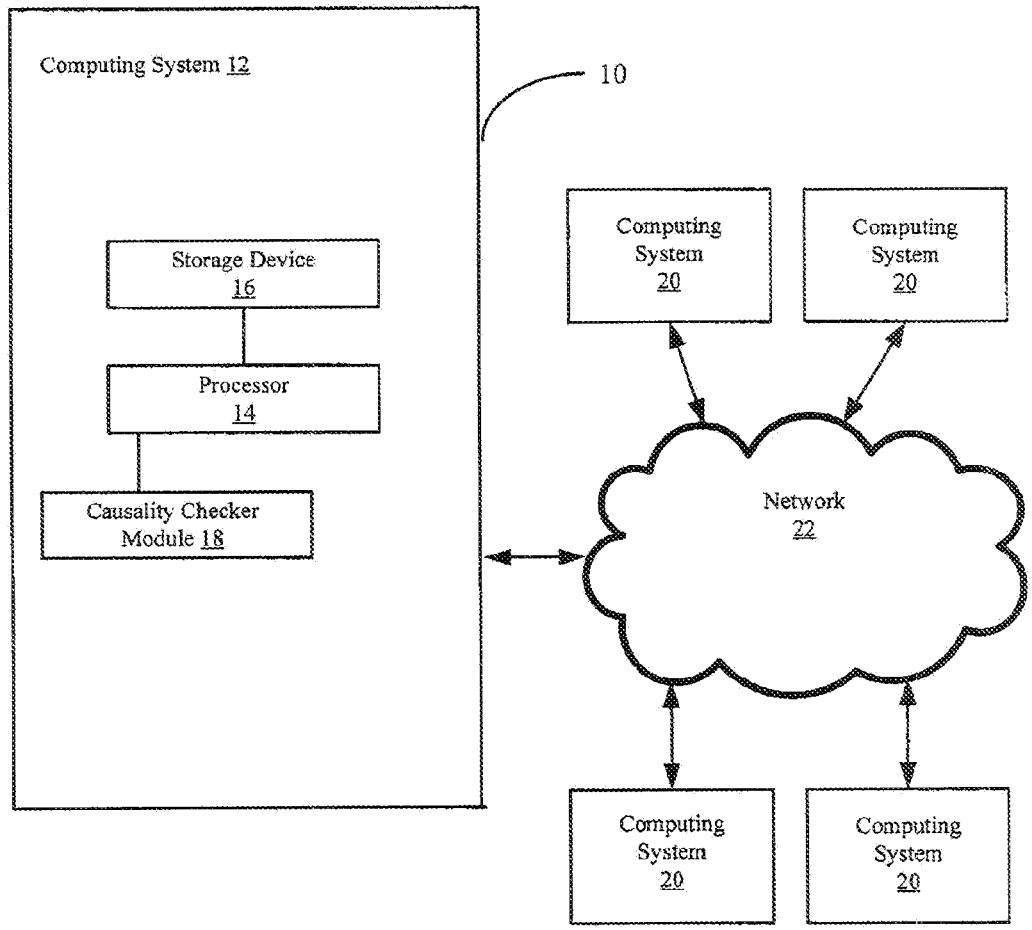
FIG. 1 illustrates various embodiments of a system.

FIG. 1 illustrates various embodiments of a system 10. The system 10 may be utilized to determine causality of any transfer function of linear time invariant systems. For purposes of simplicity, the system 10 will be described in the context of being utilized to determine causality of tabulated S-parameters (i.e., S-parameters for tabulated frequency responses). As described in more detail hereinbelow, the system 10 is configured to determine the causality in a manner similar to that disclosed by the Asgari method, but is different in that the system 10 is configured to use a global (i.e., nonpiecewise) rational function approximation for tabulated frequency responses. As the tabulated frequency response can be noncausal, the rational function is allowed to have both positive and negative real parts.

It will be appreciated that because of better approximation properties of rational functions over piecewise polynomials, the resolution (defined as smallest noncausal violations that can be detected for the given tabulated frequencies) provided by the system 10 is improved over that provided by the Asgari method. Also, by utilizing global rational functions, the system 10 does not produce unbounded values as can be produced by the Asgari method if tabulated frequencies are highly nonuniformly spaced. Furthermore, though global rational functions lead to a potential approximation problem (as opposed to an interpolation problem), they lead to a more accurate GHT result.

As used herein, the following words, phrases and symbols mean the following:

1) tabulated frequency response refers to frequency response presented in a tabular form.
2) data usually refers to multi-port data, and sometimes refers to multi-port tabulated frequency responses.
3) f refers to arbitrary linear frequency, given in Hertz.
4) ω refers to the angular frequency corresponding to $$f : \omega = 2\pi f, \text{ where } \pi = \frac{22}{7}.$$

5) $f_k$ denotes kth frequency in the Touchstone file.
6) $f_{max}$ denotes the maximum frequency in the Touchstone file. This frequency is same as the last frequency in the Touchstone file.
7) $N_f$ refers to the total number of frequencies in the Touchstone data.
8) $N_{ports}$ refers to the total number of ports in the Touchstone data.
9) scattering parameters or S-parameters are one kind of linear network parameters.
10) H(jω) is the frequency response at angular frequency ω. The symbol j is equal to $\sqrt{-1}$. The argument jω in H(jω) implies that H(jω) is complex. For the S-parameter application described herein, H(jω) refers to a port-to-port scattering parameter.
11) H(jω$_k$) denotes H(jω) for ω=ω$_k$.
12) n refers to the number of Subtraction points (or frequencies).
13) $\bar{f}_q$ refers to the qth Subtraction point or frequency.
14) $\bar{\omega}_q : \bar{\omega}_q = 2\pi \bar{f}_q$.
15) A is the minimum amplitude of noncausality that needs to be detected in data.
16) ∈ is the fraction of bandwidth for which causality test need not be done.
17) $\bar{H}(j\omega)$ is the continuous approximation of tabulated frequency response H(jω$_k$) in the closed interval ω∈[−ω$_{max}$, ω$_{max}$].
18) $H_n(j\omega)$ is the analytical generalized Hilbert transform (GHT) of H(jω).
19) $\hat{H}_n(j\omega) : H_n(j\omega)$ evaluated with finite-bandwidth tabulated response.
20) $E_n(j\omega)$ is the error between $H_n(j\omega)$ and $\hat{H}_n(j\omega)$ This error is also known as the truncation error.
21) $T_n(j\omega)$ is the tight upper bound for $E_n(j\omega)$ and is denoted as the truncation error bound. $\tilde{H}_n(j\omega)$: numerically approximation to finite-bandwidth GHT $\hat{H}_n(j\omega)$.
22) $\tilde{D}_n(\omega)$ is the error in computing $\hat{H}_n(j\omega)$ numerically. This error is also known as the discretization error.
23) $\tilde{D}_n(\omega)$ is an estimate for the upper bound of $|D_n(j\omega)|$.
24) $\Delta_n(j\omega)$ is the difference between H(jω) and its generalized Hilbert transform $H_n(j\omega)$. This quantity is also referred to as the ideal reconstruction error.
25) $\tilde{\Delta}_n(j\omega)$ is the difference between H(jω) and $\tilde{H}_n(j\omega)$. This quantity is referred to as the reconstruction error.
26) μ1 refers to the first interpolation/approximation function for H(jω$_k$).
27) μ2 refers to the second interpolation/approximation function for H(jω$_k$).
28) target fitting error is the maximum value of the absolute value of error between the approximation and the H(jω) at ω$_k$'s.
29) $\delta_1$ refers to target fitting error for $\mu_1$.
30) $\delta_2$ refers to target fitting error for $\mu_2$.

31) $N_p$ refers to the number of poles in the rational function fit.
32) Pi refers to the ith pole in the rational function fit.
33) $r_i$ refers to the ith residue in the rational function fit.
34) d refers to the value of the rational function for $\omega=\infty$.
35) $\alpha$ is a real number between 0 and 1.
36) $\beta$ is a real number between 0 and 1.
37) $D_{target}$ is a real number. It is preferred that $\tilde{D}_n(\omega_k)$ does not exceed $D_{target}$.

The system 10 includes a computing system 12 which includes a processor 14, a storage device 16 and a causality checker module 18. The computing system 12 may include any suitable type of computing device (e.g., a server, a desktop, a laptop, etc.) that includes the processor 14. Various embodiments of the computing system 12 are described in more detail hereinbelow with respect to FIG. 2.

The causality checker module 18 is communicably connected to the processor 14, and is configured to check tabulated S-parameters for causality. The causality checker module 18 is configured to check for causality in a manner similar to that disclosed by the Asgari method, but is different in that the causality checker module 18 is configured to use a global (i.e., nonpiecewise) rational function approximation for tabulated frequency responses.

By using a global (i.e., nonpiecewise) rational function approximation in place of piecewise polynomials, the drawbacks associated with the Asgari method are avoided. The rational function approximation to $H(j\omega)$ is given by $$H(j\omega) \approx \overline{H}(j\omega) = \sum_{i=1}^{N_p} \frac{r_i}{j\omega - p_i} + d, \quad (17)$$

where $r_i$ is the residue corresponding to the ith pole $p_i$, d is the direct term, and $N_p$ is the total number of poles. The quantities $r_i$'s, $p_i$'s and d can be obtained by algorithms such as vector fitting such as, for example, that disclosed in the in the publication "Rational Approximation of Frequency Domain Responses by Vector Fitting", IEEE Trans. on Power Delivery, Vol. 14, No. 3, July 1999 authored by Bjorn Gustavsen. However, unlike in the traditional vector fitting, the poles $p_i$'s are not forced to be stable (e.g., the poles are allowed to have both positive and negative real parts). This relaxation on the poles enables the fitting error at the tabulated frequencies to be arbitrarily controlled. In general, any function utilized by the system 10 for approximating tabulated response for causality checking purposes should be able to approximate both causal and noncausal tabulated responses.

Substituting for $H(j\omega)$ from equation (17) into equation (6), one gets the rational function counterpart to equation (15), namely:

$$\tilde{H}_n(j\omega) = \mathcal{L}_H(j\omega) + \frac{1}{j\pi}\left(\overline{H}(j\omega)\mathbb{L}(\omega, -\omega_{max}, \omega_{max}) - \right.$$

$$\sum_{q=1}^{n} \overline{H}(j\overline{\omega}_q)\mathbb{L}(\omega_q, -\omega_{max}, \omega_{max})\prod_{\substack{p=1\\p\neq q}}^{n} \frac{\omega - \overline{\omega}_p}{\overline{\omega}_q - \overline{\omega}_p} +$$

$$\left.\sum_{i=1}^{N_p} \frac{r_i}{j\omega - p_i} \ln\left(\frac{jp_i + \omega_{max}}{jp_i - \omega_{max}}\right)\prod_{q=1}^{n} \frac{\omega - \overline{\omega}_q}{-jp_i - \overline{\omega}_q}\right). \quad (18)$$

The second and third terms in equation (18) are similar to the corresponding terms in equation (15). The fourth term in equation (18) is new and is due to the integration of the partial fraction term containing $1/j\omega - p_i$. Unlike equation (15), equation (18) does not require extrapolation. Though equation (18) can still have unbounded values if $p_i = j\omega_k$ or if $p_i = j\overline{\omega}_q$, such situations are avoided, as standard rational fitting procedures constrain the poles to have a nonzero real part.

The quantity $\tilde{D}_n(\omega)$ is computed as in equation (13) but by choosing $\mu_1$ and $\mu_2$ as two different rational function approximations to $\overline{H}(j\omega)$ with different approximation errors. Care should, however, be taken in finding these approximations. If the approximation errors are slightly different, then $\tilde{D}_n(\omega)$ will become large; as a result equation (12) may not be satisfied. If, on the other hand, the errors are almost the same, the interpolation error is not taken into account sufficiently, leading to a smaller value for $\tilde{D}_n(\omega)$.

This care can be taken if the target fitting errors for $\mu_1$ and $\mu_2$ are varied accordingly. The target fitting errors are chosen using the following heuristic. Because the target fitting error affects the bound $\tilde{D}_n(\omega)$, a target value for the bound $\tilde{D}_n(\omega)$ is first decided: if $D_{target}$ denotes the target discretization error bound, then it is chosen as $$D_{target} = \alpha A, \quad (19)$$

where $0 \leq \alpha \leq 1$. In this work, $\alpha$ is set to 0.1. With the intention of meeting equation (12), n is chosen such that $$T_n(\omega_k) \leq (1-\alpha)A \; \forall k. \quad (20)$$

The target fitting error for $\mu_1$, namely $\delta_1$, is chosen as a small fraction of $D_{target}$, i.e., $$\delta_1 = \beta D_{target}, \quad (21)$$

where $0 \leq \beta \leq 1$. In this example, $\beta$ is set to 0.2. The target fitting error for $\mu_2$, namely $\delta_2$, is chosen as a number significantly different from $\delta_1$ yet not much greater than $D_{target}$. In this example, $$\delta_2 = 5\delta_1, \quad (22)$$

and A is chosen as $10^{-2}$.

Let $S_{i,j}(\omega_k)$ denote the scattering parameter entry corresponding to ports i and j and at frequency $\omega k$. Then, an exemplary step-by-step procedure implemented by the causality checker module 18 to test whether or not a $S_{i,j}(j\omega)$ is causal is given in the exemplary algorithm described hereinbelow. For Nports>1, the following applies. The test for the multi-port data is declared inconclusive if the test is inconclusive for any $S_{i,j}$; in this case, the test has to be repeated with a smaller frequency steps. The test for the multi-port data is declared conclusive if there are no entry with an inconclusive test. The multi-port data are declared noncausal if the test for the multi-port data is conclusive, and at least one entry is declared noncausal. The multi-port data are declared causal if the test for the multi-port data is conclusive, and all entries are declared causal.

The exemplary algorithm implemented by the causality checker module 18 to test whether or not a given tabulated frequency response is causal is as follows. Given tabulated scattering parameters (S-parameters) for frequencies in the closed interval $[0, f_{max}]$, and given a maximum error $\delta_{fit}$ that can be tolerated between the tabulated frequency response and a causal macromodel to it (e.g., 0.01), and given a fraction of the bandwidth $f_{max}$, where the fraction is represented as $\in$ (e.g., 0.05):
1) Set $A = \delta_{fit}$
2) Set $\alpha = 0.1$ 3) Set $\beta=0.2$
4) Find the smallest even n such that the maximum value of $T_n(\omega)$ in equation (10) in the frequency interval $|\omega| \leq \bar{\omega}_n$ satisfies the inequality (20).
5) With the n found, compute $T_n(\omega_k)$ for $\omega_k \leq \bar{\omega}_n$.
6) Compute $D_{target}$ based on equation (19).
7) Compute $\delta_1$ based on equation (21).
8) Compute $\delta_2$ based on equation (22).
9) Compute $\mu_1$ from equation (17) with a target fitting error $\delta_1$.
10) Compute $\mu_2$ from equation (17) with a target fitting error $\delta_2$.
11) Compute $\tilde{H}_n(j\omega_k)$ corresponding to $\mu_1$ based on equation (18) and store the result in $\tilde{H}_n^{\mu_2}(j\omega_k)$.
12) Compute $\tilde{H}_n(j\omega_k)$ corresponding to $\mu_2$ based on equation (18) and store the result in $\tilde{H}_n^{\mu_2}(j\omega_k)$.
13) Compute $\tilde{D}_n(\omega_k)$ based on equation (13).
14) If the condition set forth in inequality (12) is met, proceed to step 15. However, if the condition set forth in inequality (12) is not met, the test is inconclusive (so return to step 1 and regenerate the data with smaller frequency steps).
15) Compute $\tilde{\Delta}_n(j\omega)$ corresponding to $\mu_1$ based on equation (4).
16) If the condition set forth in inequality (11) is met, $H(j\omega_k)$ is not causal. Otherwise, $H(j\omega_k)$ is causal.

Figure 3A:
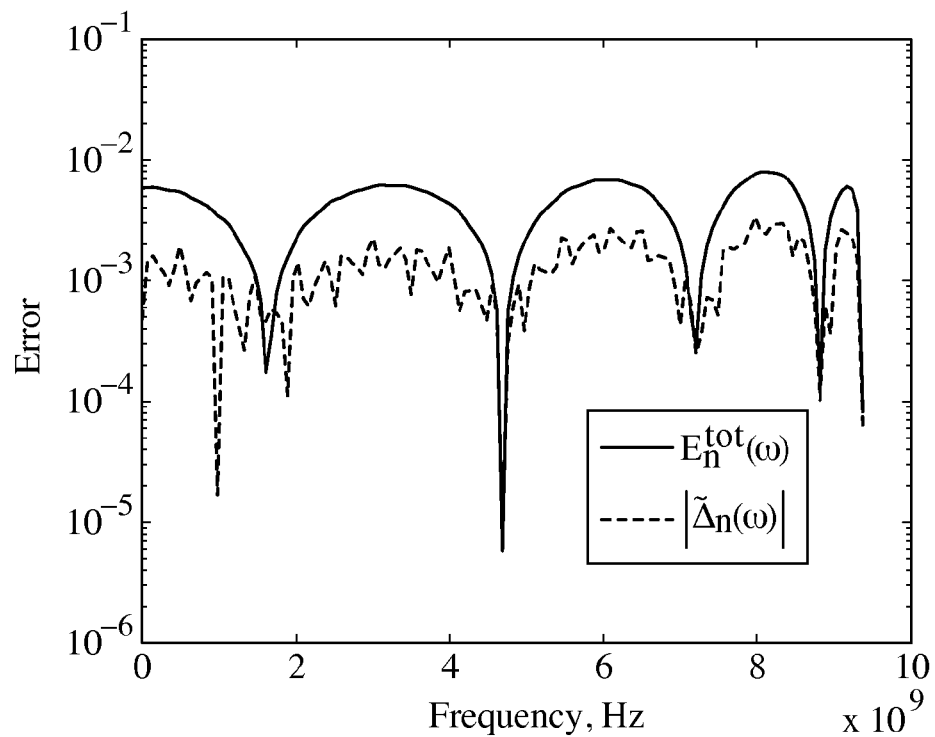
FIGS. 3A, 3B, 4A, 4B and 5 show improved results realized by using the system of FIG. 1.
Figure 3B:
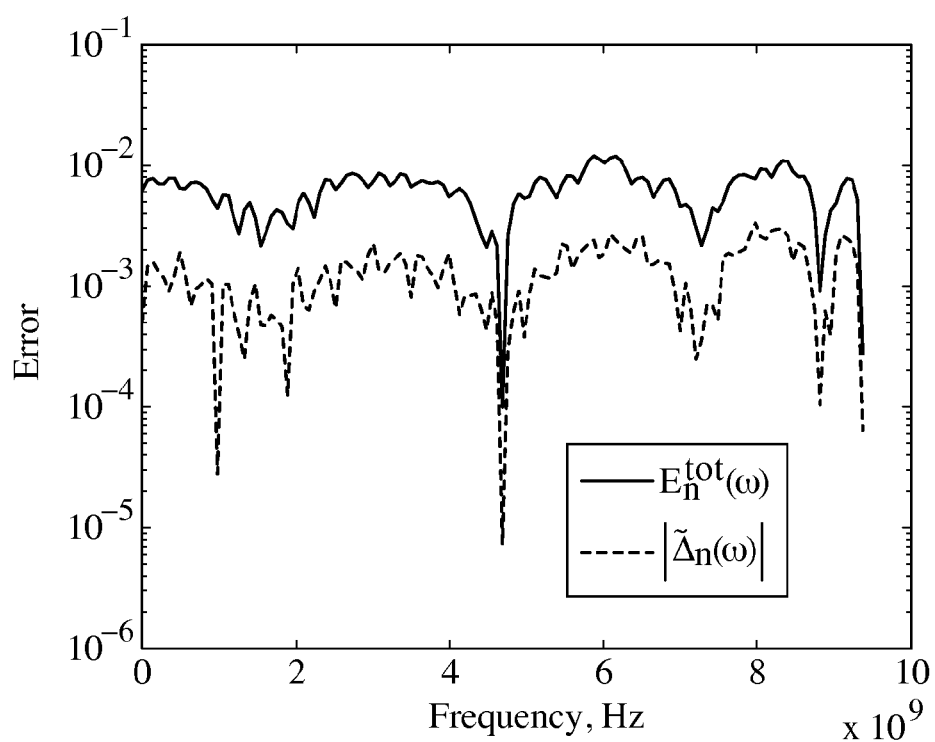

The improvements realized by utilizing the causality checker module 18 are demonstrated through some numerical results. The need for accounting the interpolation error is demonstrated first. Tabulated $S_{2,1}$ of a lossless transmission line is considered for causality testing. The line has a characteristic impedance of 75 Ω and a propagation delay of 1 nanosecond. S-parameters are computed between the interval [0, 0.994 GHz] in steps of 70 MHz. To get a result that does not account for interpolation, the result is computed using the Triverio method, and by choosing cubic splines as the interpolation function during numerical integration. To get a result that accounts for the interpolation error, the result is computed using the Asgari method. Corresponding causality plots, comparing the absolute value of the magnitude of the error as determined by equation (4) with the value of the right hand side of equation (12) are shown in FIG. 3A (without accounting for interpolation error) and FIG. 3B (accounting for interpolation error). Per FIG. 3A, the response is declared noncausal (because inequalities (12) and (11) are met). However, this is a false-positive outcome. Per FIG. 3B, the test is declared inconclusive (because inequality (12) is not met) and needs to be repeated with smaller frequency steps.

Figure 4A:
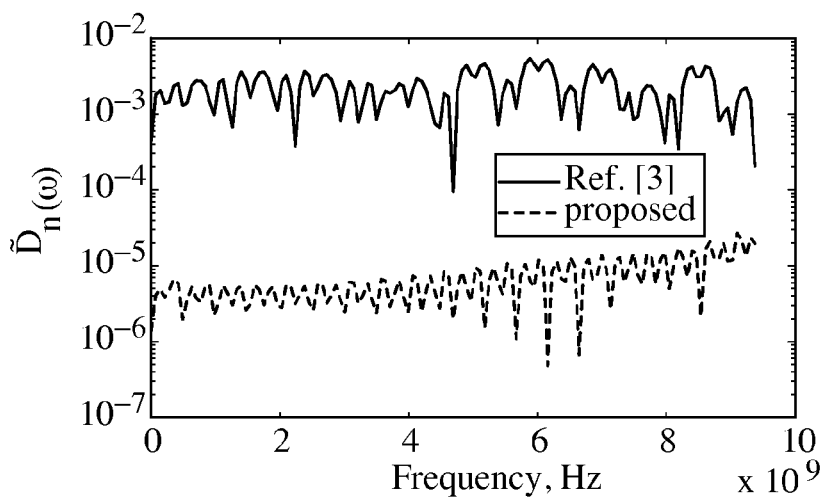
Figure 4B:
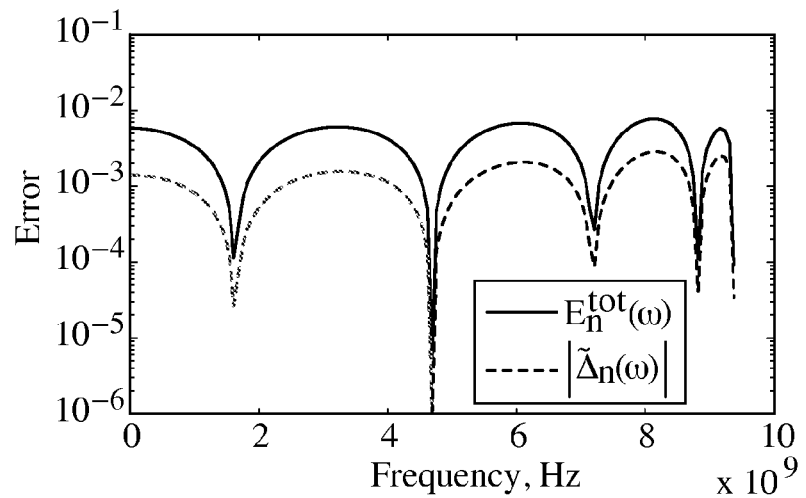

To demonstrate the improved resolution provided by the causality checker module 18, $\tilde{D}_n(\omega)$'s computed using the Asgari method and using the causality checker module 18 are compared in FIG. 4A. As can be seen, $\tilde{D}_n(\omega)$ computed using the causality checker module 18 is much smaller than that from using the Asgari method. The larger $\tilde{D}_n(\omega)$ made the test inconclusive (see FIG. 3B). However, this is not the case using the causality checker module 18 (see FIG. 4B). The macromodeling error was also computed. The worst fitting error in the passive macromodel for this data was $0.6 \times 10^{-2}$.

Figure 5:
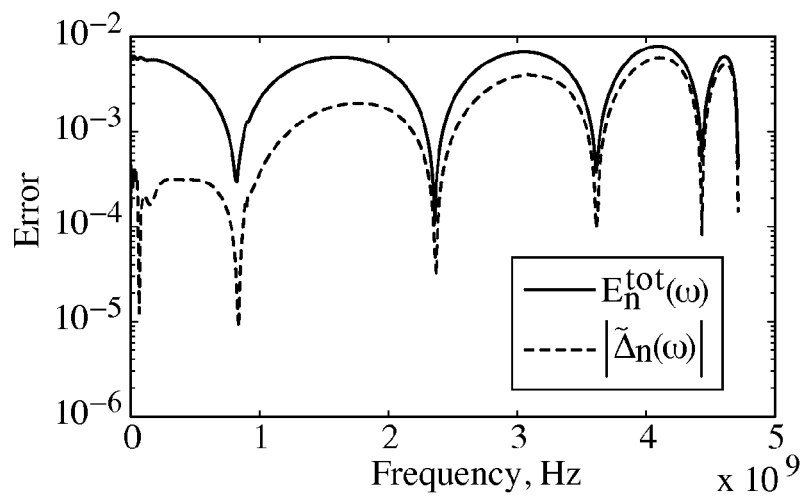

The second example is from Ansys SIwave. The data (9-port data) are between [0, 5 GHz], and are known at nonuniform frequency steps. The causality results from using the Asgari method for $S_{4,4}$ are unbounded, causing the inequality (12) not to be met. However, the results from the proposed method are bounded (see FIG. 5), and the sampled response is declared causal: inequality (12) is met, and inequality (11) is not. The worst fitting error in the passive macromodel for this data is $0.7 \times 10^{-2}$.

The causality checker module 18 may be implemented in hardware, firmware, software and combinations thereof. For embodiments utilizing software, the software may utilize any suitable computer language (e.g., C, C++, C#, Perl, Java, JavaScript, Visual Basic, VBScript, Delphi) and may be embodied permanently or temporarily in any type of machine, component, physical or virtual equipment, storage medium, or propagated signal capable of delivering instructions to a device. The causality checker module 18 (e.g., software application, computer program) may be stored on a computer-readable medium (e.g., disk, device, and/or propagated signal) such that when a computer reads the medium, the functions described herein-above are performed. According to various embodiments, the above-described functionality of the causality checker module 18 may be distributed amongst additional modules and/or sub-modules. For example, the functionality of the causal checker module 18 may be distributed amongst a truncation error bound module, a discretization error bound module, a target fitting error module, etc.

Although the casualty checker module 18 is shown as being integral with the computing system 12, it will be appreciated that according to other embodiments, the casualty checker module 18 is communicably connected to but separate from the computing system 12. For example, according to various embodiments, the causality checker module 18 resides at a remote computing device which is communicably connected to the computing system 12.

As shown in FIG. 1, the system 10 may be communicably connected to a plurality of computing systems 20 via one or more networks 22. Each of the one or more networks 22 may include any type of delivery system including, but not limited to, a local area network (e.g., Ethernet), a wide area network (e.g. the Internet and/or World Wide Web), a telephone network (e.g., analog, digital, wired, wireless, fiber optic, PSTN, ISDN, GSM, GPRS, and/or xDSL), a packet-switched network, a radio network, a television network, a cable network, a satellite network, and/or any other wired or wireless communications network configured to carry data. A given network 22 may include elements, such as, for example, intermediate nodes, proxy servers, routers, switches, and adapters configured to direct and/or deliver data. In general, the system 10 may be structured and arranged to communicate with the computing systems 20 via the one or more networks 22 using various communication protocols (e.g., HTTP, HTTPS, TCP/IP, UDP, WAP, WiFi, Bluetooth) and/or to operate within or in concert with one or more other communications systems.

Figure 2:
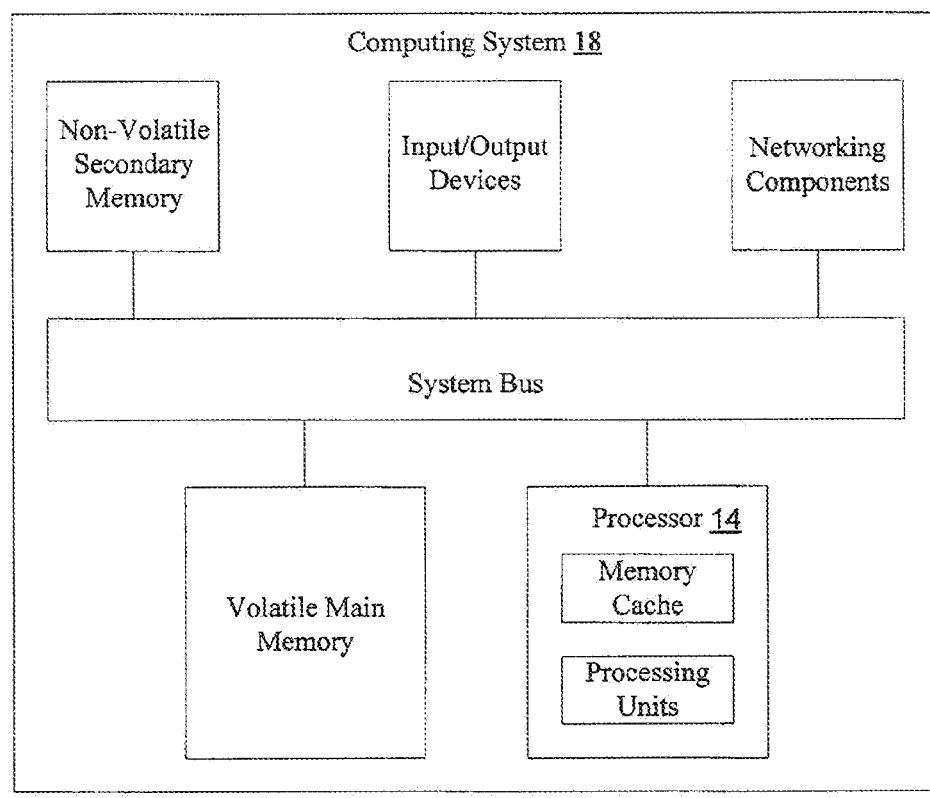
FIG. 2 illustrates various embodiments of a computing system of the system of FIG. 1.

FIG. 2 illustrates various embodiments of the computing system 12. The computing system 12 may be embodied as one or more computing devices, and includes networking components such as Ethernet adapters, non-volatile secondary memory such as magnetic disks, input/output devices such as keyboards and visual displays, volatile main memory, and the processor 14. Each of these components may be communicably connected via a common system bus. The processor 14 includes processing units and on-chip storage devices such as memory caches.

According to various embodiments, the computing system 12 includes one or more modules which are implemented in software, and the software is stored in non-volatile memory devices while not in use. When the software is needed, the software is loaded into volatile main memory. After the software is loaded into volatile main memory, the processor 14 reads software instructions from volatile main memory and performs useful operations by executing sequences of the software instructions on data which is read into the processor 14 from volatile main memory. Upon completion of the useful operations, the processor 14 writes certain data results to volatile main memory.

Figure 6:
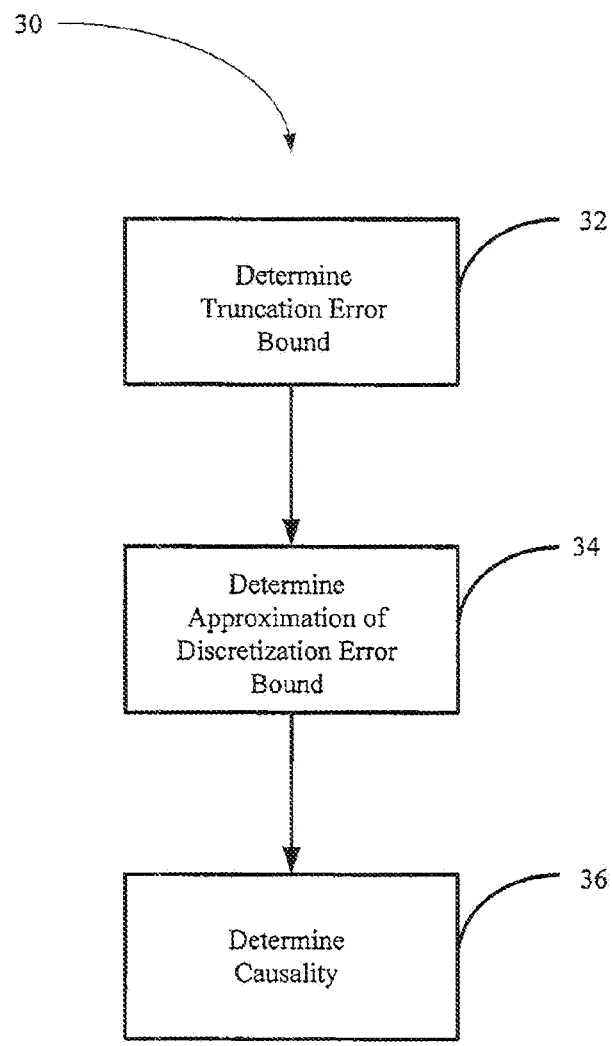
FIG. 6 illustrates various embodiments of a method.

FIG. 6 illustrates various embodiments of a method 30. The method 30 may be utilized to test causality for transfer functions of linear time invariant systems. For purposes of simplicity, the method 30 will be described at a high level in the context of testing causality of tabulated S-parameters utilizing the system 10. Prior to the start of the process, S-parameters are tabulated for a given application.

The process starts at block 32, where a truncation error bound for a given S-parameter is determined by the causality checker module 18. The truncation error bound can be denoted as $E_n(j\omega)$, and is the difference between $\hat{H}_n(j\omega)$ and $H_n(j\omega)$ as shown in equation (7). As set forth hereinabove, the truncation error bound can be controlled by increasing or decreasing n. The causality checker module 18 determines the value for $\hat{H}_n(j\omega)$ based on equation (6) and the value for $H_n(j\omega)$ based on equation (5).

From block 32, the process advances to block 34, where an approximation of the discretization error bound for the given S-parameter is determined by the causality checker module 18. The approximation of the discretization error bound can be denoted as $\tilde{D}_n(\omega)$, and is the difference between two different rational function approximations to $H(j\omega)$ (i.e., $\mu_1$ and $\mu_2$) with different approximation/target fitting errors (i.e., $\delta_1$ and $\delta_2$). According to various embodiments, the causality checker module 18 determines the respective values for the approximation/target fitting errors $\delta_1$ and $\delta_2$ based on equations (21) and (22), then the respective values for the two rational approximation functions $\mu_1$ and $\mu_2$ based on equation (17). The causality checker module 18 then determines the value for $\tilde{D}_n(\omega)$ based on equation (13), where the respective values for the two different rational function approximations to $H(j\omega)$ (i.e., $\tilde{H}_n^{\mu 1}(j\omega_k)$ and $\tilde{H}_n^{\mu 2}(j\omega_k)$ are determined based on equation (18).

From block 34, the process advances to block 36, where the causality checker module 18 determines whether a given tabulated frequency response is causal. According to various embodiments, the causality checker module 18 determines, for a given tabulated frequency response, whether the condition set forth in inequality (12) is met. If the condition set forth in inequality (12) is not met, the test for causality is deemed inconclusive. For such instances, the data may be regenerated using smaller frequency steps and tested once again for causality.

However, if the condition for inequality (12) is met, the causality checker module 18 computes $\tilde{\Delta}_n(j\omega)$ for $\mu_1$ based on equation (4), then determines whether the condition set forth in inequality (11) is met. If the condition set forth in inequality (11) is met, the causality checker module 18 deems the tabulated frequency response not causal. However, if the condition set forth in inequality (11) is not met, the causality checker module 18 deems the tabulated frequency response causal.

Nothing in the above description is meant to limit the invention to any specific materials, geometry, or orientation of elements. Many part/orientation substitutions are contemplated within the scope of the invention and will be apparent to those skilled in the art. The embodiments described herein were presented by way of example only and should not be used to limit the scope of the claimed invention.

Although the invention has been described in terms of particular embodiments in this application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered only to facilitate comprehension of the invention and should not be construed to limit the scope thereof.

What is claimed is:

1. A system, comprising:
a computing device having a processor; and
a causality checker module communicably connected to the processor for use in simulating the behavior of a physical system based on data from the physical system, wherein the causality checker module is configured to:
utilize the data from the physical system to perform a rational function approximation to a frequency response to determine if a transfer function of a linear time invariant system is causal; and
calculate a value for the rational function approximation based on the following equation:

$$H(j\omega) \approx \overline{H}(j\omega) = \sum_{i=1}^{N_P} \frac{r_i}{j\omega - p_i} + d, \tag{17}$$

wherein the $H(j\omega)$ is the frequency response at angular frequency $\omega$, $\overline{H}(j\omega)$ is a rational function approximation, $N_p$ is a number of poles, $r_i$ is the $i_{th}$ residue, $p_i$ is $i_{th}$ pole, and d is a direct term;
wherein, upon verification of causality of the transfer function, perform a simulation of the physical system using the causal transfer function;
wherein the physical system is built or modified based on results of the simulation of the physical system.

2. The system of claim 1, wherein the transfer function comprises an s-parameter.

3. The system of claim 1, wherein the linear time invariant system comprises an electrical system.

4. The system of claim 1, wherein the causality checker module is further configured to calculate a value for a target fitting error for the rational function approximation.

5. The system of claim 1, wherein the causality checker module is further configured to calculate a value for a truncation error bound associated with the frequency response.

6. The system of claim 1, wherein the causality checker module is further configured to calculate a value for a discretization error bound based on the following formula:

$$\tilde{D}_n(\omega) \approx |\tilde{H}_n^{\mu 1}(j\omega) - \tilde{H}_n^{\mu 2}(j\omega)|, \tag{13}$$

wherein $\mu_1$ and $\mu_2$ are two different interpolating functions.

7. The system of claim 6, wherein the causality checker module is further configured to calculate values for the expressions $\tilde{H}_n^{\mu 1}(j\omega)$ and $\tilde{H}_n^{\mu 2}(j\omega)$ based on the following equation:

$$\overline{H}_n(j\omega) = \mathcal{L}_{\overline{H}}(j\omega) + \frac{1}{j\pi}\left(\overline{H}(j\omega)\mathbb{L}(\omega, -\omega_{max}, \omega_{max}) - \right. \tag{18}$$

-continued $$\sum_{q=1}^{n} \overline{H}(j\overline{\omega}_q) \mathbb{L}(\overline{\omega}_q, -\omega_{max}, \omega_{max}) \prod_{\substack{p=1 \\ p \neq q}}^{n} \frac{\omega - \overline{\omega}_p}{\overline{\omega}_q - \overline{\omega}_p} +$$

$$\sum_{i=1}^{N_P} \frac{r_i}{j\omega - p_i} \ln\left(\frac{jp_i + \omega_{max}}{jp_i - \omega_{max}}\right) \prod_{p=1}^{n} \frac{\omega - \overline{\omega}_q}{-jp_i - \overline{\omega}_q}\right),$$

wherein $L_H(j\omega)$ is the Lagrange interpolation polynomial for $H(j\omega)$.

8. The system of claim 1, wherein the causality checker module is further configured
to determine if the condition of the following equation is met:

$$E_n^{tot}(\omega_k) = T_n(\omega_k) + \tilde{D}(\omega_k) \leq A \; \forall k, \quad (12)$$

where $E_n(j\omega)$ is a truncation error based on $H_n(j\omega)$.

9. The system of claim 1, wherein the causality checker module is further configured
to determine if the condition of the following inequality is met:

$$|\tilde{\Delta}_n(j\omega_k)| > T_n(\omega_k) + D_n(\omega_k) \exists k, \quad (11)$$

where $D_n(j\omega)$ is the error in numerically computing $H_n(j\omega)$ numerically with finite-band-width tabulated response.

10. The system of claim 1, wherein the causality checker module is further configured to determine causality of multi-port tabulated data.

11. The system of claim 1, wherein the physical system is an electrical network, wherein the electrical network is build or modified based on the simulation of the electrical network.

12. A method, implemented at least in part by a computing device, for testing causality of a transfer function of a linear time invariant system for simulating the behavior of a physical system based on data from the physical system, the method comprising:

determining a value of a truncation error bound for a frequency response associated with the linear time invariant system that is developed using the data from the physical system, wherein the determining is performed by the computing device;

determining a value for an approximation for a discretization error bound for the frequency response utilizing a rational function approximation to the frequency response, wherein the determining is performed by the computing device, wherein determining the value for the approximation for the discretization error bound comprises determining a value for the rational function approximation based on the following equation:

$$H(j\omega) \approx \overline{H}(j\omega) = \sum_{i=1}^{N_P} \frac{r_i}{j\omega - p_i} + d, \quad (17)$$

wherein the $H(j\omega)$ is the frequency response at angular frequency $\omega$, $\overline{H}(j\omega)$ is a rational function approximation, $N_p$ is a number of poles, $r_i$ is the $i_{th}$ residue, $p_i$ is $i_{th}$ pole, and $d$ is a direct term;

determining whether the transfer function is causal based on the value for the approximation for the discretization error bound, wherein the determining is performed by the computing device;

wherein, upon verification of causality of the transfer function, a simulation of the physical system is performed using the causal transfer function;

wherein the physical system is built or modified based on results of the simulation of the physical system.

13. The method of claim 12, wherein determining the value of the truncation error bound comprises determining the value for a frequency response associated with an electrical system.

14. The method of claim 12, wherein determining the value for the approximation for
the discretization error bound comprises setting amplitude A in the following equation to a predetermined value:

$$E_n^{tot}(\omega_k) = T_n(\omega_k) + \tilde{D}(\omega_k) \leq A \; \forall k, \quad (12)$$

where $E_n(j\omega)$ is a truncation error based on $H_n(j\omega)$.

15. The method of claim 12, wherein determining the value for the approximation for the discretization error bound comprises calculating a value for a target fitting error for the rational function approximation.

16. The method of claim 12, wherein determining the value for the approximation for the discretization error bound further comprises calculating a value for a discretization error bound based on the following equation:

$$\tilde{D}_n(\omega) \approx |\tilde{H}_n^{\mu 1}(j\omega) - \tilde{H}_n^{\mu 2}(j\omega)|, \quad (13)$$

wherein $\mu_1$ and $\mu_2$ are two different interpolating functions.

17. The method of claim 12, wherein the causality checker module is further configured to calculate values for the expressions $\tilde{H}_n^{\mu 1}(j\omega)$ and $\tilde{H}_n^{\mu 2}(j\omega)$ based on the following equation:

$$\tilde{H}_n(j\omega) = \mathcal{L}_H(j\omega) + \frac{1}{j\pi}\left(\overline{H}(j\omega)\mathbb{L}(\omega, -\omega_{max}, \omega_{max}) - \right. \quad (18)$$

$$\sum_{q=1}^{n} \overline{H}(j\overline{\omega}_q) \mathbb{L}(\overline{\omega}_q, -\omega_{max}, \omega_{max}) \prod_{\substack{p=1 \\ p \neq q}}^{n} \frac{\omega - \overline{\omega}_p}{\overline{\omega}_q - \overline{\omega}_p} +$$

$$\sum_{i=1}^{N_P} \frac{r_i}{j\omega - p_i} \ln\left(\frac{jp_i + \omega_{max}}{jp_i - \omega_{max}}\right) \prod_{q=1}^{n} \frac{\omega - \overline{\omega}_q}{-jp_i - \overline{\omega}_q}\right),$$

wherein $L_H(j\omega)$ is the Lagrange interpolation polynomial for $H(j\omega)$.

18. The method of claim 12, wherein determining whether the transfer function is causal comprises determining whether an S-parameter is causal.

19. The method of claim 18, wherein determining whether the s-parameter is causal comprises calculating a value for an approximation of an upper bound of the discretization error based on the following equation:

$$\tilde{D}_n(\omega) \approx |\tilde{H}_n^{\mu 1}(j\omega) - \tilde{H}_n^{\mu 2}(j\omega)|, \quad (13)$$

wherein $\mu_1$ and $\mu_2$ are two different interpolating functions.

20. The method of claim 18, wherein determining whether the S-parameter is causal comprises determining whether the following inequality is met:

$$E_n^{tot}(\omega_k) = T_n(\omega_k) + \tilde{D}(\omega_k) \leq A \; \forall k, \quad (12)$$

where $E_n(j\omega)$ is a truncation error based on $H_n(j\omega)$.

21. The method of claim 18, wherein determining whether the s-parameter is causal comprises calculating a value for a reconstruction error based on the following equation:

$$\tilde{\Delta}_n(j\omega) = \tilde{H}_n(j\omega) - H(j\omega), \quad (4)$$

where $\tilde{\Delta}_n(j\omega_k)$ is the different between $H(j\omega)$ and a generalized Hilbert transform $H_n(j\omega)$.

22. The method of claim 18, wherein determining whether the S-parameter is causal comprises determining whether the following inequality is met:

$$|\tilde{\Delta}_n(j\omega_k)| > T_n(\omega_k) + D_n(\omega_k) \exists k, \quad (11)$$

where $D_n(j\omega)$ is the error in numerically computing $H_n(j\omega)$ numerically with finite-band-width tabulated response.

23. The method of claim 12, further comprising determining causality of multi-port tabulated data, wherein the determining is performed by the computing device.

\* \* \* \* \*